US010447288B2

(12) United States Patent
Muhoberac

(10) Patent No.: US 10,447,288 B2
(45) Date of Patent: Oct. 15, 2019

(54) SELF-TRACKING AND SELF-RANGING WINDOW ANALOG-TO-DIGITAL CONVERTER

(71) Applicant: Dialog Semiconductor (UK) Limited, London (GB)

(72) Inventor: Ivan Muhoberac, Graz (AT)

(73) Assignee: Dialog Semiconductor (UK) Limited, London (GB)

(*) Notice: Subject to any disclaimer, the term of this patent is extended or adjusted under 35 U.S.C. 154(b) by 0 days.

(21) Appl. No.: 16/227,073

(22) Filed: Dec. 20, 2018

(65) Prior Publication Data
US 2019/0190527 A1 Jun. 20, 2019

(30) Foreign Application Priority Data
Dec. 20, 2017 (DE) .......................... 10 2017 223 466

(51) Int. Cl.
*H03M 1/00* (2006.01)
*H03M 1/06* (2006.01)
(52) U.S. Cl.
CPC ........... *H03M 1/007* (2013.01); *H03M 1/002* (2013.01); *H03M 1/0602* (2013.01)
(58) Field of Classification Search
CPC .......................... H03M 1/002; H03M 1/0602
USPC ................................................ 341/118–155
See application file for complete search history.

(56) References Cited

U.S. PATENT DOCUMENTS

| | | | |
|---|---|---|---|
| 5,231,398 A * | 7/1993 | Topper | H03M 1/188 341/139 |
| 8,229,049 B1 | 7/2012 | Logue | |
| 2005/0062482 A1 | 3/2005 | Vincent et al. | |
| 2006/0152204 A1* | 7/2006 | Maksimovic | H02M 1/38 323/284 |
| 2006/0272831 A1 | 12/2006 | Maksimovic et al. | |

(Continued)

OTHER PUBLICATIONS

German Office Action, File No. 10 2017 223 466.0, Applicant: Dialog Semiconductor (UK) Limited, dated Sep. 4, 2018, 10 pages, and English language translation, 7 pages.

(Continued)

*Primary Examiner* — Lam T Mai
(74) *Attorney, Agent, or Firm* — Saile Ackerman LLC; Stephen B. Ackerman

(57) ABSTRACT

This disclosure relates to an analog-to-digital converter, ADC. The ADC comprises a first detection and second detection line, each including a plurality of serially arranged detection units, where the detection units of the first line are controlled in accordance with a first signal and the detection units of the second line are controlled in accordance with a second signal, and each line comprises a first group of serially arranged detection units and a second group of serially arranged detection units, a pulse generator for generating a periodic pulse signal that is fed to each of the lines, a sampling unit configured to read out values held by the detection units of the first group in one of the first and second lines on occurrence of a pulse of the pulse signal reaching a predetermined detection unit of the other one of the first and second lines, and a detection line control unit configured to adjust a delay of the second group of detection units in the one of the first and second lines in accordance with a read out of the detection units of the first group of detection units.

28 Claims, 8 Drawing Sheets

(56) References Cited

U.S. PATENT DOCUMENTS

| | | | | |
|---|---|---|---|---|
| 2006/0273831 | A1* | 12/2006 | Maksimovic | H03M 1/1042 327/103 |
| 2008/0042632 | A1* | 2/2008 | Chapuis | H02M 3/157 323/283 |
| 2008/0164859 | A1* | 7/2008 | Peng | H02M 3/157 323/318 |
| 2008/0204296 | A1* | 8/2008 | Prodic | H03M 1/502 341/155 |
| 2017/0294917 | A1* | 10/2017 | Kris | H03K 5/131 |
| 2017/0294919 | A1* | 10/2017 | Kris | H03K 5/131 |
| 2017/0294920 | A1* | 10/2017 | Kris | H03K 5/131 |
| 2017/0297917 | A1* | 10/2017 | Pang | B01J 19/0013 |
| 2018/0026648 | A1* | 1/2018 | Kris | H03K 5/14 341/155 |
| 2018/0183453 | A1* | 6/2018 | Kris | H03K 5/131 |
| 2018/0198461 | A1* | 7/2018 | Kris | H03K 5/131 |

OTHER PUBLICATIONS

German Office Action, File No. 10 2017 223 466.0, Applicant: Dialog Semiconductor (UK) Limited, dated Feb. 7, 2019, 14 pages, and English language translation, 11 pages.

Electronic Circuits Handbook for Design and Applicaitons, U. Tietze et al, 2nd edition, Copyright: Springer 2002, ISBN 978-3-540-00429-5, pp. 772-775.

"A Power and Area Efficient 65 nm CMOS Delay Line ADC for On-chip Voltage Sensing," by Sida Amy Shen et al., 2012 IEEE International Conference on Electron Devices and Solid State Circuit (EDSSC), Dec. 3-5, 2012, 4 pages.

"Delay-Line-Based Analog-to-Digital Converters," by Guansheng Li et al., IEEE Transactions on Circuits and Systems—II: Express Briefs, vol. 56, No. 6, Jun. 2009, pp. 464-468.

"A Miniature 2 mW 4 bit 1.2 GS/s Delay-Line-Based ADC on 65 m CMOS," by Yahya M. Tousi et al., IEEE Journal of Solid-State Circuits, vol. 46, No. 10, Oct. 2011, pp. 2312-2325.

\* cited by examiner

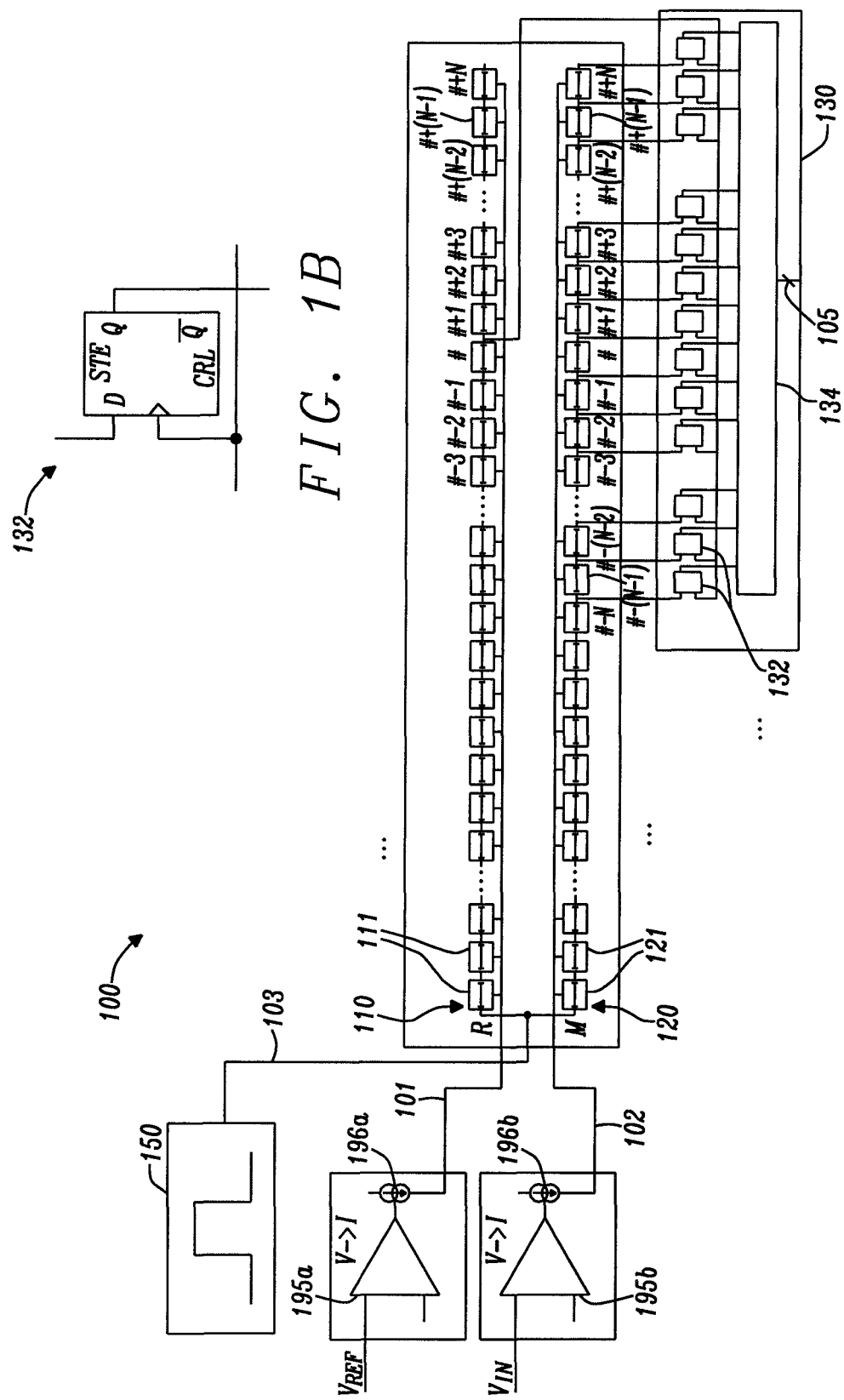

SELF-TRACKING AND SELF-RANGING WINDOW ANALOG-TO-DIGITAL CONVERTER

TECHNICAL FIELD

This application relates to analog-to-digital converters (ADCs), for example delay line ADCs, and methods of operating ADCs, e.g., for converting an input analog signal or an input analog signal differential (differential input analog signal) to a digital value. These ADCs include single-ended and differential ADCs. The application particularly relates to delay line ADCs that have any or all of reduced complexity, footprint, and current consumption.

BACKGROUND

In conventional delay line ADCs (as a non-limiting example of an ADC using cell-based detection in strings of consecutively coupled detection cells) a sampling window having a size (number of detection cells) conforming to the desired bit resolution of the delay line ADC is required. Consider, for example, a differential delay line ADC including, for each of its two delay lines, a total number of N detection units (detection cells, delay units, delay cells, unit cells) in the sampling window. This ADC would have to also include a corresponding number of sampling latches (e.g., including flip flops) together with an encoder (digital encoder, e.g., thermal to binary) capable of reading out the N values held by these N detection units and appropriately processing these N values. A single-ended delay line ADC with the same bit resolution would be required to include, for its measurement line, a total number of (2N−1) detection units in the sampling window and corresponding sampling latches together with an encoder capable of reading out the (2N−1) values held by these (2N−1) detection units and appropriately processing these (2N−1) values. Accordingly, complexity, wiring, footprint and current consumption of conventional delay line ADCs increase in proportion to their desired bit resolution.

SUMMARY

Thus, there is a need for a delay line ADC that can achieve high bit resolution at lower complexity, footprint, and/or current consumption. There is a further need for a delay line ADC that can dynamically adapt its bit resolution to thereby adaptively reduce current consumption for times at which only a lower bit resolution is desired. There is yet further need for methods of operating such delay line ADCs.

In view of some or all of these needs, the present disclosure proposes delay line ADCs (window ADCs) and methods of operating delay line ADCs, having the features of the respective independent claims.

An aspect of the disclosure relates to an analog-to-digital converter, ADC. The ADC may perform analog-to-digital conversion using cell-based detection in strings of consecutively connected detection cells. For example, the ADC may be a delay line ADC. The ADC may include a first delay line (as a non-limiting example of a detection line) and a second delay line (as a non-limiting example of a detection line). Each delay line may include a plurality of serially (e.g., sequentially) arranged digital delay units (or delay cells, as non-limiting examples of detection cells/unit cells). The delay units may be serially coupled (e.g., connected). The delay units of the first delay line may be controlled in accordance with a first signal (first control signal). The delay units of the second delay line may be controlled in accordance with a second signal (second control signal). Each delay unit (as a non-limiting example of a detection cell) may apply a certain delay to a signal that is fed to the delay unit, in accordance with the respective control signal. The first and second signals may be current signals or voltage signals, for example. In general, the first and second signals may be analog signals. Higher signal amplitudes (signal magnitudes, e.g., higher currents or voltages) of the first and second signals may control respective delay units to apply a shorter delay to a pulse propagating through respective delay units. Each delay line may include a first group of serially arranged delay units and a second group of serially arranged delay units. The first group of delay units of the first delay line may have the same length (in terms of delay units) as the first group of delay units of the second delay line. The second group of delay units of the first delay line may have the same length (in terms of delay units) as the second group of delay units of the second delay line. The first groups of delay units may be referred to as forming a sampling stage of the ADC. The length of the first groups of delay units may be said to correspond to a sampling window size (window size, window length) or bit resolution of the ADC. The second groups of delay units may be said to form a tracking section of the ADC. The ADC may further include a pulse generator for generating a periodic pulse signal that is fed to each of the first and second delay lines. In particular, the periodic pulse signal may be fed to respective first delay units (first in line) in the first and second delay lines. The ADC may further include a sampling unit configured to read out values held by the delay units of the first group of delay units in one of the first and second delay lines on occurrence of a pulse of the pulse signal reaching a predetermined delay unit (triggering unit) of the other one of the first and second delay lines. For example, the predetermined delay unit may be the last delay unit of that delay line. For example, the pulse reaching an end of that delay line may trigger the read out (sampling, latching) in the respective other delay line. The ADC may yet further include a delay line control unit (as a non-limiting example of a detection line control unit) configured to adjust a delay of the second group of delay units in the one of the first and second delay lines in accordance with a read out of the delay units of the first group of delay units in the one of the first and second delay lines. The delay of that second group of delay units may be adjusted by selectively bypassing delay units. For example, a switching operation may be performed to selectively remove delay units in the second group of delay units from the main signal path of the one of the first and second delay lines.

Thereby, the delay (run through time) of the slower delay line is shortened and the difference between the run through times of the two delay lines is reduced. This allows to align the timings at which a pulse reaches the sampling section in the two delay lines. In other words, the run through time difference, if any, can be brought into the sampling window to be detectable by the sampling, even for a comparatively short sampling window. On the other hand, since the amount (in terms of delay unit) by which the slower delay line has been shortened is known, a digital value representing the full difference between run through times of the two delay lines (that would be present without shortening) can be reconstructed. This value then is a faithful digital representation of the input analog signal (e.g., voltage). Moreover, this digital value can have a higher bit resolution than would be offered by the comparatively short sampling window alone. In other words, the length of the sampling window can be reduced for a given desired bit resolution. This means that the number of sampling cells and latches can be reduced, wiring complexity can be reduced, and complexity of an encoder for processing the sampled values can be reduced. In consequence, complexity, footprint (area), and power consumption of the ADC (e.g., delay line ADC) can be reduced.

In some embodiments, the number of bypassed delay units (i.e., the number of delay units that are to be bypassed for the next pulse) in the second group of delay units of the one of the first and second delay lines may depend on the number of delay units in the first group of delay units of the one of the first and second delay lines that hold values indicating absence of a pulse on occurrence of the pulse of the pulse signal reaching the predetermined delay unit of the other one of the first and second delay lines. In general, the number of bypassed delay units (i.e., the number of delay units that are to be bypassed for the next pulse) in the second group of delay units of the one of the first and second delay lines may depend on the sampled delay (difference in run through times, e.g., in terms of delay units) between the first and second delay lines.

Thereby, the timings at which the pulses propagating through the first and second delay lines arrive that the first groups of delay units (i.e., at the sampling section) may be aligned, thus ensuring that any delay (difference in run through times) between the delay lines can be detected by the sampling.

In some embodiments, an output of the ADC may depend on (e.g., may be given by) a sum of the number of delay units that are currently bypassed on occurrence of the pulse of the pulse signal reaching the predetermined delay unit of the other one of the first and second delay lines and the number of delay units in the first group of delay units of the one of the first and second delay lines that hold values indicating absence of a pulse on occurrence of the pulse of the pulse signal reaching the predetermined delay unit of the other one of the first and second delay lines. In general, the output of the ADC may depend on the number of delay units that are currently bypassed on occurrence of the pulse of the pulse signal reaching the predetermined delay unit of the other one of the first and second delay lines and the sampled delay (difference in run through times, e.g., in terms of delay units) between the first and second delay lines.

Accordingly, despite the shorting (bypassing) in the one of the first and second delay lines, a meaningful representation of the would-be difference in run through times, and thus of the input analog signal (e.g., voltage), can be obtained. In other words, the eventual digital output is not affected by the bypassing. It is important to note that the digital output value can indicate a delay (difference in run through times) between the first and second delay lines that is in excess of the sampling window of the ADC (e.g., delay line ADC).

In some embodiments, the delay of the second group of delay units in the one of the first and second delay lines may be adjusted for the next pulse of the pulse signal. That is, readout of the one of the first and second delay lines is performed for a given pulse of the pulse signal, and the delay of the second group of delay units of that delay line is adjusted for propagation of the next (i.e., subsequent) pulse of the pulse signal. Each pulse may be said to correspond to, or indicate, a cycle for the ADC.

In some embodiments, the first signal and the second signal may be indicative of an input analog signal (e.g., voltage) differential and may be offset from a common mode signal by opposite signs. The common mode signal may have zero amplitude in some cases. Thereby, a differential delay line ADC can be implemented.

In some embodiments, the first signal may be indicative of a fixed reference analog signal (e.g., voltage) and the second signal may be indicative of an input analog signal (e.g., voltage). In this case, the first delay line may be referred to as a reference line. The second delay line may be referred to as a measurement line or measure line. Further, the one of the first and second delay lines may be the second delay line and the other one of the first and second delay lines may be the first delay line. In other words, the reference line triggers the read-out of the measurement line, and it may be the delay of the second group of delay units of the measurement line that is adjusted. Thereby, a single-ended delay line ADC can be implemented.

In some embodiments, the delay line control unit may be further configured to adjust a delay of the second group of delay units in the first delay line and a delay of the second group of delay units in the second delay line by the same amount (e.g., in terms of delay units). This may be done by selectively bypassing delay units. The delay of the second group of delay units in the first delay line and the delay of the second group of delay units in the second delay line may be adjusted in accordance with a desired resolution of the ADC.

Accordingly, the delay line lengths can be dynamically adjusted to adjust to a desired bit resolution and/or dynamic range for the delay line ADC. Reducing the delay line lengths results in a reduction of power consumption. Thus, in cases in which a lower bit resolution is needed, the delay line ADC can be adapted to such requirements and the power consumption of the delay line ADC can be (temporarily) reduced.

In some embodiments, the ADC may further include an input stage. The input stage may include one or more operational amplifiers for generating the first and second signals from one or more input analog signals (e.g., voltages).

Another aspect of the disclosure relates to an analog-to-digital converter, ADC. The ADC may perform analog-to-digital conversion using cell-based detection in strings of consecutively connected detection cells. For example, the ADC may be a delay line ADC. The ADC may include a first delay line (as a non-limiting example of a detection line) and a second delay line (as a non-limiting example of a detection line). Each delay line may include a plurality of serially (e.g., sequentially) arranged digital delay units (or delay cells, as non-limiting examples of detection cells/unit cells). The delay units may be serially coupled (e.g., connected). The delay units of the first delay line may be controlled in accordance with a first signal (first control signal). The delay units of the second delay line may be controlled in accordance with a second signal (second control signal). Each delay unit (as a non-limiting example of a detection cell) may apply a certain delay to a signal that is fed to the delay unit, in accordance with the respective control signal. The first and second signals may be current signals or voltage signals, for example. In general, the first and second signals may be analog signals. Higher signal amplitudes (signal magnitudes, e.g., higher currents or voltages) of the first and second signals may control respective delay units to apply a shorter delay to a pulse propagating through respective delay units. Each delay line may include a first group of serially arranged delay units and a second group of serially arranged delay units. The first group of delay units of the first delay line may have the same length (in terms of delay units) as the first group of delay units of the second delay line. The second group of delay units of the first delay line may have the same length (in terms of delay units) as the second group of delay units of the second delay line. The first groups of delay units may be referred to as forming a sampling stage of the ADC. The length of the first groups of delay units may be said to correspond to a sampling window size (window size, window length) or bit resolution of the ADC. The second groups of delay units may be said to form a tracking section of the ADC. The ADC may further include a pulse generator for generating a periodic pulse signal that is fed to each of the first and second delay lines. In particular, the periodic pulse signal may be fed to respective first delay units (first in line) in the first and second delay lines. The ADC may further include a sampling unit configured to read out values held by the delay units of the first group of delay units in one of the first and second delay lines on occurrence of a pulse of the pulse signal reaching a predetermined delay unit (triggering unit) of the other one of the first and second delay lines. For example, the predetermined delay unit may be the last delay unit of that delay line. For example, the pulse reaching an end of that delay line may trigger the read out (sampling, latching) in the respective other delay line. The ADC may yet further include a delay line control unit (as a non-limiting example of a detection line control unit) configured to adjust a delay of the second group of delay units in the first delay line and a delay of the second group of delay units in the second delay line by the same amount. This may be done by selectively bypassing delay units. For example, a switching operation may be performed to selectively remove delay units in the second group of delay units from the main signal path of the one of the first and second delay lines.

In some embodiments, the delay of the second group of delay units in the first delay line and the delay of the second group of delay units in the second delay line may be adjusted in accordance with a desired resolution of the ADC.

Accordingly, the delay line lengths can be dynamically adjusted to adjust to a desired bit resolution and/or dynamic range for the delay line ADC. Reducing the delay line lengths results in a reduction of power consumption. Thus, in cases in which a lower bit resolution is needed, the delay line ADC can be adapted to such requirements and the power consumption of the delay line ADC can be (temporarily) reduced.

Another aspect of the disclosure relates to a method of controlling an ADC. The ADC may perform analog-to-digital conversion using cell-based detection in strings of consecutively connected detection cells. For example, the ADC may be a delay line ADC. The ADC may include a first delay line (as a non-limiting example of a detection line) and a second delay line (as a non-limiting example of a detection line). Each delay line may include a plurality of serially (e.g., sequentially) arranged digital delay units (or delay cells, as non-limiting examples of detection cells/unit cells). The delay units may be serially coupled (e.g., connected). The delay units of the first delay line may be controlled in accordance with a first signal (first control signal). The delay units of the second delay line may be controlled in accordance with a second signal (second control signal). Each delay unit (as a non-limiting example of a detection ell) may apply a certain delay to a signal that is fed to the delay unit, in accordance with the respective control signal. The first and second signals may be analog signals, such as current signals or voltage signals, for example. Higher signal amplitudes (signal magnitudes, e.g., higher currents or voltages) of the first and second signals may control respective delay units to apply a shorter delay to a pulse propagating through respective delay units. Each delay line may include a first group of serially arranged delay units and a second group of serially arranged delay units. The first group of delay units of the first delay line may have the same length (in terms of delay units) as the first group of delay units of the second delay line. The second group of delay units of the first delay line may have the same length (in terms of delay units) as the second group of delay units of the second delay line. The first groups of delay units may be referred to as forming a sampling stage of the delay line ADC. The length of the first groups of delay units may be said to correspond to a sampling window size (window size, window length) or bit resolution of the delay line ADC. The second groups of delay units may be said to form a tracking section of the delay line ADC. The method may include generating a periodic pulse signal and feeding the periodic pulse signal to each of the first and second delay lines. In particular, the periodic pulse signal may be fed to respective first delay units (first in line) in the first and second delay lines. The method may further include reading out (sampling, latching) values held by the delay units of the first group of delay units in one of the first and second delay lines on occurrence of a pulse of the pulse signal reaching a predetermined delay unit of the other one of the first and second delay lines. The method may yet further include adjusting a delay of the second group of delay units in the one of the first and second delay lines in accordance with a read out of the delay units of the first group of delay units in the one of the first and second delay lines. The delay of that second group of delay units may be adjusted by selectively bypassing delay units. For example, a switching operation may be performed to selectively remove delay units from the main signal path.

In some embodiments, the number of bypassed delay units (i.e., the number of delay units that are to be bypassed for the next pulse) in the second group of delay units of the one of the first and second delay lines may depend on the number of delay units in the first group of delay units of the one of the first and second delay lines that hold values indicating absence of a pulse. In general, the number of bypassed delay units (i.e., the number of delay units that are to be bypassed for the next pulse) in the second group of delay units of the one of the first and second delay lines may depend on the sampled delay (difference in run through times, e.g., in terms of delay units) between the first and second delay lines.

In some embodiments, the method may further include outputting a digital value that depends on a sum of the number of delay units that are currently bypassed on occurrence of the pulse of the pulse signal reaching the predetermined delay unit of the other one of the first and second delay lines and the number of delay units in the first group of delay units of the one of the first and second delay lines that hold values indicating absence of a pulse on occurrence of the pulse of the pulse signal reaching the predetermined delay unit of the other one of the first and second delay lines. In general, the output of the delay line ADC may depend on the number of delay units that are currently bypassed on occurrence of the pulse of the pulse signal reaching the predetermined delay unit of the other one of the first and second delay lines and the sampled delay (difference in run through times, e.g., in terms of delay units) between the first and second delay lines.

In some embodiments, the delay of the second group of delay units in the one of the first and second delay lines may be adjusted for the next pulse of the pulse signal.

In some embodiments the first signal and the second signal may be indicative of an input analog signal (e.g., voltage) differential and may be offset from a common mode signal by opposite signs.

In some embodiments, the first signal may be indicative of a fixed reference analog signal (e.g., voltage). The second signal may be indicative of an input analog signal (e.g., voltage). In this case, the first delay line may be referred to as a reference line. The second delay line may be referred to as a measurement line or measure line. Further, the one of the first and second delay lines may be the second delay line and the other one of the first and second delay lines may be the first delay line. In other words, the reference line triggers the read-out of the measurement line, and it may be the delay of the second group of delay units of the measurement line that is adjusted.

In some embodiments, the method may further include adjusting a delay of the second group of delay units in the first delay line and a delay of the second group of delay units in the second delay line by the same amount. This may be done by selectively bypassing delay units. The delay of the second group of delay units in the first delay line and the delay of the second group of delay units in the second delay line may be adjusted in accordance with a desired resolution of the delay line ADC.

In some embodiments, the method may further include generating the first and second signals from one or more input analog signals (e.g., voltages) by means of one or more operational amplifiers.

Yet another aspect of the disclosure relates to a method of controlling an ADC. The ADC may perform analog-to-digital conversion using cell-based detection in strings of consecutively connected detection cells. For example, the ADC may be a delay line ADC. The ADC may include a first delay line (as a non-limiting example of a detection line) and a second delay line (as a non-limiting example of a detection line). Each delay line may include a plurality of serially (e.g., sequentially) arranged digital delay units (or delay cells, as non-limiting examples of detection cells/unit cells). The delay units may be serially coupled (e.g., connected). The delay units of the first delay line may be controlled in accordance with a first signal (first control signal). The delay units of the second delay line may be controlled in accordance with a second signal (second control signal). Each delay unit (as a non-limiting example of a detection ell) may apply a certain delay to a signal that is fed to the delay unit, in accordance with the respective control signal. The first and second signals may be analog signals, such as current signals or voltage signals, for example. Higher signal amplitudes (signal magnitudes, e.g., higher currents or voltages) of the first and second signals may control respective delay units to apply a shorter delay to a pulse propagating through respective delay units. Each delay line may include a first group of serially arranged delay units and a second group of serially arranged delay units. The first group of delay units of the first delay line may have the same length (in terms of delay units) as the first group of delay units of the second delay line. The second group of delay units of the first delay line may have the same length (in terms of delay units) as the second group of delay units of the second delay line. The first groups of delay units may be referred to as forming a sampling stage of the delay line ADC. The length of the first groups of delay units may be said to correspond to a sampling window size (window size, window length) or bit resolution of the delay line ADC. The second groups of delay units may be said to form a tracking section of the delay line ADC. The method may include generating a periodic pulse signal and feeding the periodic pulse signal to each of the first and second delay lines. In particular, the periodic pulse signal may be fed to respective first delay units (first in line) in the first and second delay lines. The method may further include reading out (sampling, latching) values held by the delay units of the first group of delay units in one of the first and second delay lines on occurrence of a pulse of the pulse signal reaching a predetermined delay unit of the other one of the first and second delay lines. The method may yet further include adjusting a delay of the second group of delay units in the first delay line and a delay of the second group of delay units in the second delay line by the same amount. This may be done by selectively bypassing delay units. For example, a switching operation may be performed to selectively remove delay units from the main signal path.

In some embodiments, the delay of the second group of delay units in the first delay line and the delay of the second group of delay units in the second delay line may be adjusted in accordance with a desired resolution of the delay line ADC.

Notably, the method may be applied to any of the circuits (delay line ADCs) described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly).

BRIEF DESCRIPTION OF THE DRAWINGS

Example embodiments of the disclosure are explained below with reference to the accompanying drawings, wherein like reference numbers indicate like or similar elements, and wherein FIG. 1A schematically illustrates an example of a single-ended delay line analog-to-digital converter (ADC).

FIG. 1B schematically illustrates a latch, used in the single-ended delay line of FIG. 1A.

DETAILED DESCRIPTION

Figures 2A, 2B:
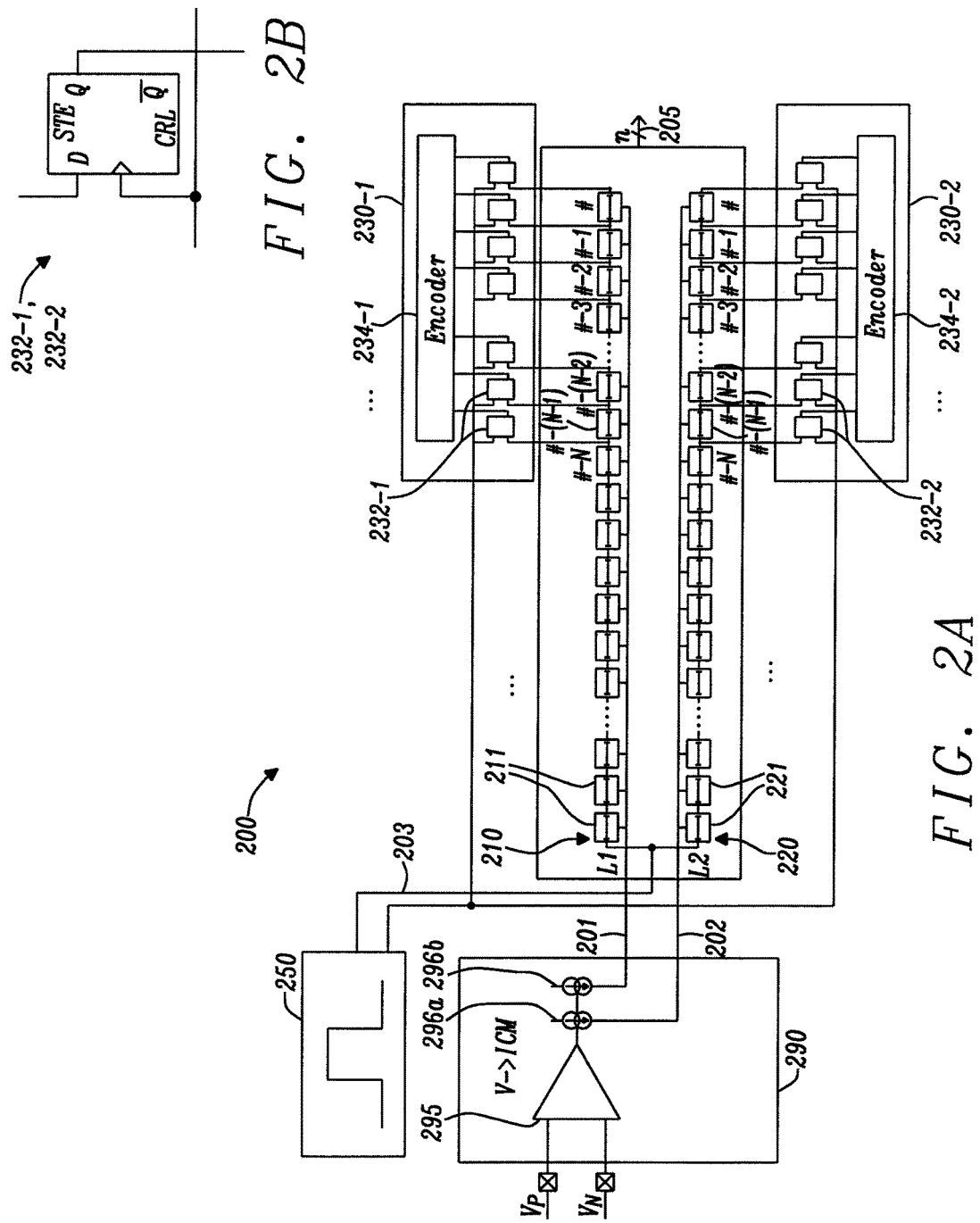
FIG. 2A schematically illustrates an example of a differential delay line ADC.
FIG. 2B schematically illustrates a latch, used in the differential delay line of FIG. 2A.

An example of a single-ended (non-differential) delay line ADC 100 is shown in FIG. 1A. In this particular example the delay line ADC is an N bit windowed delay line ADC. The architecture is based on a measurement (M) line 120 and reference (R) line 110. Each line comprises a plurality of serially arranged (e.g., coupled) digital delay units (delay cells, detection cells, unit cells) 111, 121. The delay units 111 of the reference line 110 are controlled by a first signal (first control signal) 101 that is generated from a fixed reference voltage VREF, e.g., by means of a first operational amplifier 195a and a first controllable current source 196a that operates under control of an output of the first operational amplifier 195a. Therein, the delay that is applied by the delay units 111 of the reference line 110 to a signal (e.g., pulse) propagating along the reference line 110 depends on a magnitude (amplitude) of the first signal 101. For example, the greater the magnitude of the first signal 101, the smaller the delay that is applied by each delay unit 111 of the reference line 110. Since the first signal 101 has constant magnitude, the reference line 110 has a fixed run through time. The delay units 121 of the measurement line 120 are controlled by a second signal (second control signal) 102 that is generated from an input voltage (a voltage to be digitized) $V_{IN}$, e.g., by means of a second operational amplifier 195b and a second controllable current source 196b that operates under control of an output of the second operational amplifier 195b. The delay that is applied by the delay units 121 of the measurement line 120 to a signal (e.g., pulse) propagating along the measurement line 120 depends on a magnitude of the second signal 102. For example, the greater the magnitude of the second signal 102, the smaller the delay that is applied by each delay unit 121 of the measurement line 120. Since the second signal 102 varies over time as the input voltage VIN varies, the measurement line 120 has variable run through time.

The delay line ADC 100 comprises a pulse generator 150 (clock generator) for generating a periodic pulse signal 103 (e.g., a periodic signal comprising a plurality of successive pulses, such as rectangular pulses, for example). The pulse signal 103 is fed to both the reference line 110 and the measurement line 120, such that the pulses of the pulse signal can propagate along the reference line 110 and the measurement line 120.

The measurement line 120 comprises, e.g., towards the end of the line, a number (2N−1) of sampling cells (i.e., delay units the values held by which may be sampled) and allows for N bit resolution of the analog-to-digital conversion. Values held by the sampling cells (e.g., logic 0 or logic 1) may be read-out (sampled, latched) by a digital circuit 130 comprising an encoder 134 and a plurality of latches 132 (e.g., including flip flops), one for each of the (2N−1) sampling cells. Each sampling cell is coupled (e.g., connected) to its respective latch 132. The latches 132 are controlled by a trigger signal. Outputs of the latches 132, illustrated in FIG. 1B, are provided to the encoder 134, which processes the values sampled from the sampling cells to generate a digital output 105 indicative of the input voltage VIN. For example, the encoder 134 may perform thermal to binary conversion.

The reference line 110 creates the aforementioned trigger signal for sampling (latching) the (2N−1) sampling cells in the measurement line 120. A trigger for sampling is output each time a pulse of the pulse signal reaches a predetermined cell of the reference line 110, such as cell 0 (cell #) in the reference line 110 in FIG. 1A. On occurrence of such trigger, the values held by the sampling cells of the measurement line 120 are read-out (sampled, latched). In other words, each time a pulse reaches the predetermined cell of the reference line 110, the run through difference (in units of cells) between the reference line 110 and the measurement line 120 is determined (by sampling the values held by the sampling cells). This run through difference corresponds to a certain difference in signal magnitude between the first signal 101 (depending on the reference voltage VREF) and the second signal 102 (depending on the input voltage VIN), and thus is indicative of a digitized version of the input voltage VIN.

As can be seen from FIG. 1A, the delay line ADC 100 needs to include a large number of sampling cells in the measurement line 120 and corresponding latches for providing a certain bit resolution. For reasonable matching and balancing between the two lines the reference line 110 has to have the same number of cells as the measurement line 120 and the same load (snapshot registers) as the measurement line 110. The latches 132 are usually composed of flip flops and meta-stability avoiding circuitry and cause a significant increase of area (footprint) and power consumption.

In summary, for achieving N bit resolution, the ADC 100 of FIG. 1A needs to comprise 2×(2N−1) sampling cells, 2×(2N−1) latches, appropriate wiring, as well as an encoder capable of processing 2×(2N−1) sampled values. Thus, the delay line ADC 100 of FIG. 1A displays rather large complexity, footprint, and power consumption.

An example of a differential delay line ADC 200 is shown in FIG. 2A. In this particular example the delay line ADC is a N bit windowed delay line ADC. The architecture is based on a first line (L1, first delay line) 210 and a second line (L2, second delay line) 220. Each line comprises a plurality of serially arranged (e.g., coupled) digital delay units (delay cells, detection cells, unit cells) 211, 221. The delay units 211 of the first line 210 are controlled by a first signal (first control signal) 201 and the delay units 221 of the second line 220 are controlled by a second signal (second control signal) 202. Both the first signal 201 and the second signal 202 may be analog signals (e.g., voltage signals or current signals). Further, both the first signal 201 and the second signal 202 may be based on, or correspond to, a differential input signal. For example, the first signal 201 and the second signal 202 may be generated from a differential voltage (e.g., $\Delta V_{IN} = V_P - V_N$) corresponding to a difference between a positive input voltage $V_P$ and a negative input voltage $V_N$, e.g., by means of an operational amplifier 295 and first and second controllable current sources 296a, 296b. The first signal 201 and the second signal 202 may both have a common mode (CM) contribution. The first signal 201 may be obtained by adding a current contribution that depends on the differential voltage to the common mode. The second signal 202 may be obtained by adding the same current contribution, but with opposite sign, to the common mode. The delay that is applied by the delay units 211 of the first line 210 to a signal (e.g., pulse) propagating along the first line 210 depends on a magnitude (amplitude) of the first signal 201. For example, the greater the magnitude of the first signal 201, the smaller the delay that is applied by each delay unit 211 of the first line 210. The delay that is applied by the delay units 221 of the second line 220 to a signal (e.g., pulse) propagating along the second line 220 depends on a magnitude of the second signal 202. For example, the greater the magnitude of the second signal 202, the smaller the delay that is applied by each delay unit 222 of the second line 220. Since both the first signal 201 and the second signal 202 vary over time as the differential voltage varies, both lines have variable run through times.

The delay line ADC 200 comprises a pulse generator 250 (clock generator) for generating a periodic pulse signal 203 (e.g., a periodic signal comprising a plurality of successive pulses, such as rectangular pulses, for example). The pulse signal 203 is fed to both the first line 210 and the second line 220, such that the pulses of the pulse signal can propagate along the first line 210 and the second line 220.

The first and second lines 210, 220 each comprise N sampling cells (i.e., delay units the values held by which may be sampled) so that the delay line ADC 200 allows for N bit resolution of the analog-to-digital conversion. Values held by the sampling cells (e.g., logic 0 or logic 1) of the first line 210 may be read-out (sampled, latched) by a first digital circuit 230-1 comprising a first encoder 234-1 and a plurality of latches 232-1, illustrated in FIG. 2B, (e.g., including flip flops), one for each of the N sampling cells of the first line 210. Values held by the sampling cells (e.g., logic 0 or logic 1) of the second line 220 may be read-out (sampled, latched) by a second digital circuit 230-2 comprising a second encoder 234-2 and a plurality of latches 232-2, illustrated in FIG. 2B, (e.g., including flip flops), one for each of the N sampling cells of the second line 220. Each sampling cell is coupled (e.g., connected) to its respective latch 232. The latches 232 of each digital circuit 230 are controlled by a respective trigger signal. Outputs of the latches 232-1 of the first digital circuit 230-1 are provided to the first encoder 234-1, which is configured to process the values sampled from the sampling cells of the first line 210 to generate a digital output 205 indicative of the differential voltage. Outputs of the latches 232-2 of the second digital circuit 230-2 are provided to the second encoder 234-2, which is configured to process the values sampled from the sampling cells of the second line 220 to generate a digital output 205 indicative of the differential voltage. For example, both the first encoder 234-1 and the second encoder 234-2 may perform thermal to binary conversion.

Whenever a given pulse reaches a predetermined cell (triggering cell) in the first line 210 or the predetermined cell (triggering cell) in the second line 220, a trigger for sampling (latching) is generated for the respective other line. The predetermined cell may be the last cell in the respective line, for example. Only one trigger for sampling is generated per pulse. In other words, the faster line (the line for which the pulse first reaches the predetermined cell) generates a trigger for sampling (latching) the N sampling cells of the other, slower, line, but not the other way round. On occurrence of such trigger, the values held by the sampling cells of the respective line are read-out (sampled, latched). In other words, each time a pulse reaches the predetermined cell of the faster line (this may be either line, depending on the magnitude of the first and second signals 201, 202), the run through difference (in units of cells) between the first and second lines 210, 220 is determined (by sampling the values held by the sampling cells of the slower line). This run through difference corresponds to a certain difference in signal magnitude between the first signal 201 and the second signal 202, both depending on the differential voltage, but with different sign, and thus is indicative of a digitized version of the differential voltage.

As can be seen from FIG. 2A, the delay line ADC 200 needs to include a large number of sampling cells in the first line 210 and the second line 220 and corresponding latches for providing a certain bit resolution. The demand on the number of latches per line is also strongly correlated with the desired dynamic range. The latches 232 are usually composed of flip flops and meta-stability avoiding circuitry and represent significant increase of area and power consumption.

Thus, the delay line ADCs as shown in FIG. 1A or FIG. 2A allow for high bit resolution only at the price of high sampling complexity, high wiring complexity, high power consumption, and large footprint.

By contrast, delay line ADCs according to embodiments of the disclosure allow to significantly reduce the number of sampling cells (at a given bit resolution) and thus the number of latches by implementing the tracking algorithm proposed below. These delay line ADCs can be kept fully differential. Alternatively, embodiments of the disclosure can be implemented also in single-ended delay line ADCs. In general, the concepts described in the present disclosure allow for a trade-off between input referred bandwidth (tracking speed, or how fast the output can follow the input) against power consumption, area and sampling complexity, while keeping the same input voltage range and resolution.

Broadly speaking, embodiments of the present disclosure relate to ADCs based on delay lines (sensing cells), featuring characteristic transfer functions that can be calculated as a result of the number of consecutively connected cells per line. The goal is to achieve a high resolution and dynamic range even though the number of sensing cells (and accordingly, power consumption, complexity, and footprint) is decreased compared to conventional implementations. To achieve this aim, the present disclosure proposes a novel tracking architecture combined with a reduced sampling window length. Therein, tracking is understood to refer to a dynamic adjustment (e.g., shorting/bypassing) of the delay of delay lines. Tracking is performed to align the run through times of the delay lines and may relate to selectively bypassing individual cells of the respective line. The tracking ability (by shorting own unit cells in the delay lines) enables use of a smaller sampling window and hence achieves lower power consumption. The number of tracking cells (cells potentially subject to shorting) and sensing cells (sampling cells) may depend on the application requirements.

As noted above, the tracking ability refers to shorting unit cells to thereby align run through times of the delay lines up to the sampling section. A controlled output of the delay line ADC is achieved when the run through difference, expressed in terms of sensing cells, is less than one from the goal setting and the tracking is settled within the window limits.

Figure 3:
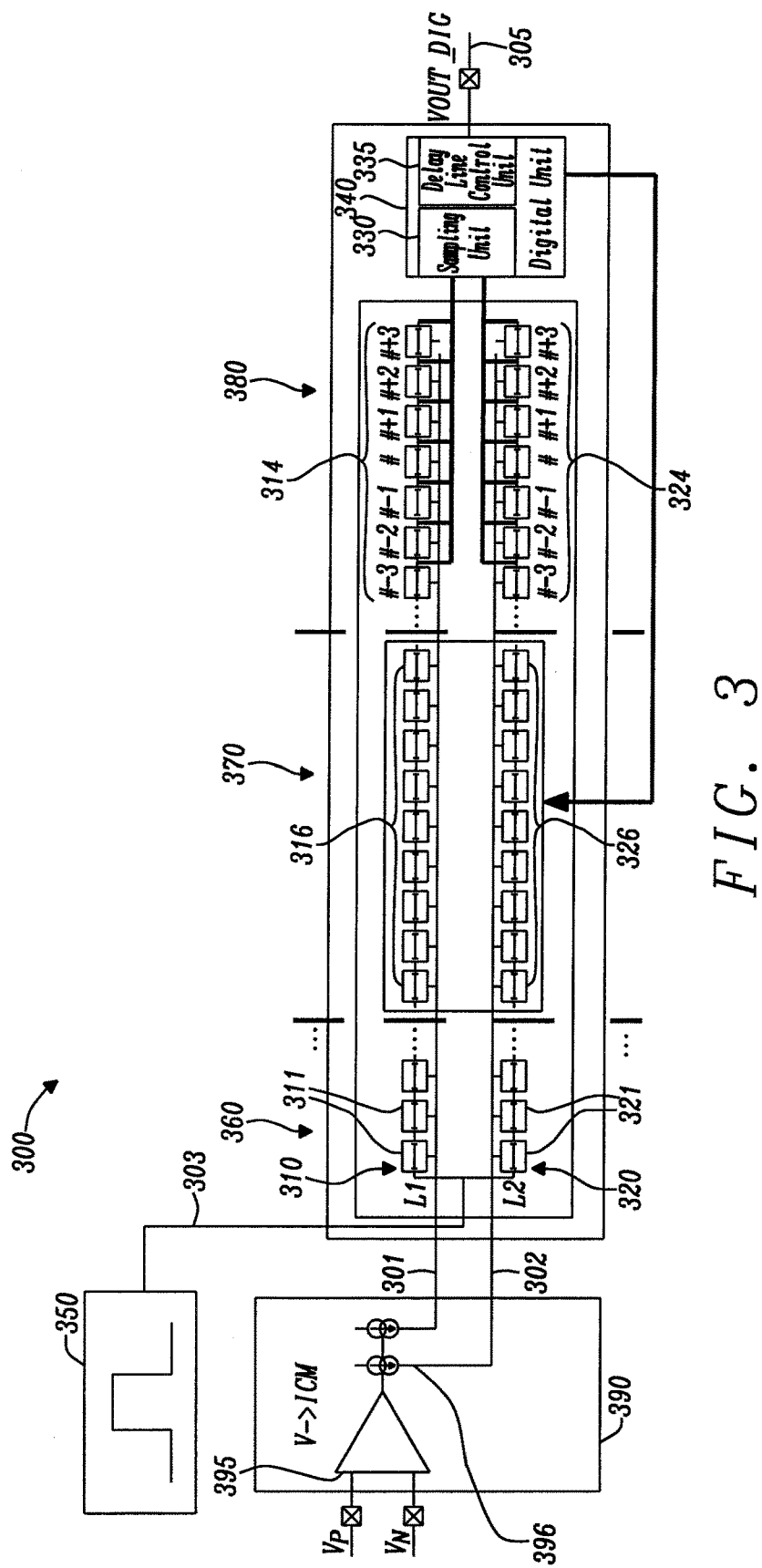
FIG. 3 schematically illustrates an example of a delay line ADC according to embodiments of the disclosure.

An example of a differential ADC 300 using cell-based detection in strings of consecutively connected detection cells according to embodiments of the disclosure is shown in FIG. 3. The ADC may be a delay line ADC, for example, to which reference will be made in the following without intended limitation. The delay line ADC 300 comprises a first delay line 310 (as a non-limiting example of a detection line) and a second delay line 320 (as a non-limiting example of a detection line). Each delay line includes a plurality of serially (e.g., consecutively) arranged (e.g., coupled, connected) delay units (or delay cells/unit cells as non-limiting examples of detections cells). The delays of the delay units 311 of the first delay line 310 are controlled in accordance with a first signal (first control signal) 301, e.g., in the same manner as described above with reference to FIG. 2A. The delays of the delay units 321 of the second delay line are controlled in accordance with a second signal (second control signal) 302, e.g., in the same manner as described above with reference to FIG. 2A. The first and second signals 301, 302 may be referred to as control signals. Each delay line comprises a first group of consecutive delay units and a second group of consecutive delay units. That is, the first delay line 310 comprises a first group 314 of delay units and a second group 316 of delay units. The second delay line 320 comprises a first group 324 of delay units and a second group 326 of delay units. The first groups 314, 324 include (e.g., consist of) sampling cells (i.e., delay units the values held by which may be sampled). The second groups 316, 326 include (e.g., consist of) tracking cells (i.e., delay units that may be selectively bypassed). The first groups of delay units 314, 324 may be said to form a sampling section 380 of the delay lines. The second groups of delay units 316, 326 may be said to form a tracking section 370 of the delay lines. Each delay line may further comprise a third group of delay units that includes (e.g., consists of) delay units that are neither sampling cells nor tracking cells. The third groups may be said to form an input section 360 of the delay lines.

In the example of FIG. 3, the first and second signals 301, 302 are indicative of an input voltage differential $\Delta V_{IN} = V_P - V_N$. The first and second signals 301, 302 may be current signals, for example, and may be generated in the same manner as described above with reference to FIG. 2A Each of the first and second signals 301, 302 may include a contribution from a common mode signal CM and may be offset from this common mode signal by a quantity depending on the differential input voltage. The offsets of the first and second signals 301, 302 from the common mode signal may have opposite sign.

The delay line ADC 300 further comprises a pulse generator 350 for generating a periodic pulse signal (e.g., a periodic signal including a plurality of equally spaced, consecutive pulses) 303. The pulse signal 303 is fed to each of the first and second delay lines 310, 320 so that the pulses can propagate along the first and second delay lines 310, 320.

The delay line ADC 300 further comprises a sampling unit 330 configured to read out (sample, latch) values held by the delay units of the first group of delay units in the first delay line 310 and the second delay line 320. In operation of the delay line ADC 300, the sampling unit 330 reads out the values held by the delay units of the first group of delay units in one of the first and second delay lines on occurrence of a pulse of the pulse signal 303 reaching a predetermined delay unit in the other one of the first and second delay lines. The predetermined delay unit may be the last delay unit in the respective delay line, for example. After a given pulse has reached the predetermined delay unit in the other one of the delay lines, sampling is not triggered again if that pulse reaches the predetermined delay unit in the one of the delay lines. In other words, the faster delay line triggers sampling (latching) of the slower delay line (but not the other way round). Either of the first and second delay lines 310, 320 may be the slower delay line, depending on the magnitudes of the control signals. This process of triggering may be the same as described above with reference to FIG. 2A. Also the process of sampling (latching) may be the same as described above with reference to FIG. 2A.

The delay line ADC 300 further comprises a delay line control unit 335 (as a non-limiting example of a detection line control unit) that adjusts the delay of the second group of delay units in the one of the first and second delay lines (i.e., in the slower delay line) in accordance with a read out of the delay units of the first group of delay units in the one of the first and second delay lines (i.e., the slower delay line). Notably, the delay line control unit 335 adjusts the delay of the second group of delay units as a whole, but it does not adjust the delay of individual delay units. In particular, the delay may be adjusted by selectively bypassing delay units in the second group of delay units in that delay line. Each delay unit in the second group of delay units may be bypassed for this purpose, e.g., by an appropriate switching operation.

In particular, for each cycle (e.g., for each pulse of the pulse signal), the number of bypassed delay units in the second group of delay units of the slower delay line for the next cycle may depend on the number of delay units in the first group of delay lines of the slower delay line that hold values indicating absence of a pulse on occurrence of sampling. In general, the number of bypassed delay units in the second group of delay units of the slower delay line for the next cycle may depend on the sampled difference in run through times (e.g., in terms of delay units) between the faster delay line and the slower delay line in the current cycle. As can be seen from the above, the decision on how many delay units should be bypassed in the next cycle is performed at the end of the current cycle, after the sampling operation has been completed.

The number of bypassed delay units in the second group of delay units of the slower delay line for the next cycle may further depend on the number of bypassed delay units in the second group of delay units in that delay line for the current cycle. For example, the number of cells that will be additionally bypassed (in addition to any previously bypassed delay units) in the next cycle may be given by the number of delay units in the first group of delay lines of the slower delay line that hold values indicating absence of a pulse on occurrence of sampling in the current cycle (or, in general, may be given by the sampled difference in run through times (e.g., in terms of delay units) between the faster delay line and the slower delay line in the current cycle).

If the faster delay line is found to include bypassed delay units, the bypassing of some or all of the bypassed delay units may be terminated. For example, the number of bypassed delay lines may be successively decremented from cycle to cycle.

In general, the number of bypassed delay units is chosen so that the run through times of the first and second delay lines are substantially aligned. Shorting (bypassing) is performed for only one delay line at a time. That is, at all times at least one of the two delay lines does not comprise any bypassed delay units (i.e., has full length). An example of the determination of the number of delay units to be bypassed is described below with reference to FIG. 4.

The sampling unit 330 and the delay line control unit 335 may be part of, form part of, or form, a digital unit (digital circuit) 340. The sampling unit 330 may comprise latches and encoders, as described above with reference to FIG. 2A.

The delay line ADC 300 outputs a digital output VOUT_DIG 305 that is indicative of the differential input voltage. For each cycle, the digital output 305 may depend on the number of delay units that are currently bypassed in the second group of the slower delay line for that cycle and on the result of the sampling, e.g., the number of delay units in the first group of delay units of the slower delay line that hold values indicating absence of a pulse (in general, the sampled difference in run through times, in terms of delay units). For example, the digital output signal 305 may depend on a sum of these numbers. In other words, a digital output signal Dout may be given by Dout=Tracking[n−1]+Sampling[n], where Tracking[n−1] indicates the number of currently bypassed delay units, as determined in the previous (n−1)-th cycle, and the sampling result Sampling[n] for the current n-th cycle.

In general, the delay line ADC 300 may be said to include a first stage, or input stage 390, as well as a second stage 380. The input stage 390 generates the first and second signals 301, 302. The input stage 390 can be represented as a differential and linear converter delivering common mode control to the second stage 380. That is, the input stage 390 may comprise one or more operational amplifiers 395 for generating the first and second signals 301, 302 from one or more input voltages (e.g., a differential input voltage). The input stage may further comprise one or more controllable current sources 396 operating under control of the operational amplifier(s).

The second stage 380 comprises two matched delay lines, namely the first delay line 310 and the second delay line 320. These delay lines are controlled by the output of the input stage 390, as described above.

Each delay line may be segmented into two or three parts: the input section, the tracking section, and the sampling section. The input section may be optional. The input section may also be referred to as a common mode section. The three sections will be described in turn below.

Input section: A clock or generated pulse is propagating through the delay units (cells) with a propagation delay controlled by the input signal difference in addition to a static common mode signal. Digital control or tracking have no impact to the run through time (pass through time) of this section.

Tracking section: This section interacts with a corresponding digital block (i.e., the delay line control unit 335) and enables shorting and hence bypassing cells to cut down the run through time.

Sampling section: Following the tracking section the pulse or clock arrives at the sampling section. Sampling (latching) is performed, for each cycle, for the sampling cells of the respective slower delay line (i.e., the delay line with the longer run through time). No tracking or shorting must be applied here.

Assuming identical control signals, the controlled propagation delay of all delay units would be equal. A generated pulse will likewise "travel" through both delay lines (L1 and L2 in FIG. 3). The digital sampling, i.e., the looking at the sampling window (sampling section), will determine a zero cell difference at the output of both lines in this case since the run through times are equal. The visible window is given by the number of cells in the sampling section connected to the digital sampling (e.g., connected to the sampling unit, e.g., via latches).

Given control signals that are different from each other, the run through times of the delay lines will change accordingly and the faster delay line will trigger a snapshot of the slower delay line. Digital sampling performs calculations and identifies the run through difference (in terms of delay units) of the delay lines. Granularity or resolution is defined by the total number of delay units used.

A digital tracking block (i.e., the delay line control unit 335) applies the determined delay difference, from the previous sample cycle, by shorting delay units (inside of the tracking section) from the slower delay line. Hereby it compensates for the slower delay line's run through time, trying to time wise align the pulses at the sampling section (i.e., such that the pulses in the two delay lines arrive at the sampling section substantially at the same time). More accurately, the delay line control unit 335 seeks to align the delays of the two delay lines with respect to the snapshot cell (predetermined delay unit, triggering delay unit) that triggers sampling of the respective other delay line (e.g., triggering the calculation of difference in run through cells at the opposite delay line). Intelligence is added once computation is performed using the tracking information from the preceding sample cycle and the actual sampling information. In this way the digital output value Dout is determined as Dout=Tracking[n−1]+Sampling[n], where n indicates the current cycle and n−1 indicates the previous cycle.

Ideally speaking the pulse run through time regardless of input signals should always be symmetrical (both lines) whereas tracking (and shorting the delay units) is applied only on one line simultaneously. The tracking limits can be set and operational (input) range restricted.

The tracking speed is determined by the range (length) of the sampling section (sampling window), which can be accumulated to be previous tracking information [n−1] within one calculation cycle.

Starting from a relatively big positive input voltage step and decreasing the input voltage, the tracking or shorting (absolutely seen) is declining as well. In this case active shorts will be removed (i.e., cells will be switched back into the main path) until the input signal reaches zero. That is, the number of bypassed delay units is successively reduced.

A further decrease of the input voltage (more negative input voltage), and hence a change in sign of the input voltage, will effect a change of sign in tracking as well. The active shorts are applied now on the respective opposite delay line, and the previously shortened delay line becomes un-shortened (i.e., there are no bypassed delay units on the respective opposite delay line; any previous bypass is removed)

Figure 4:
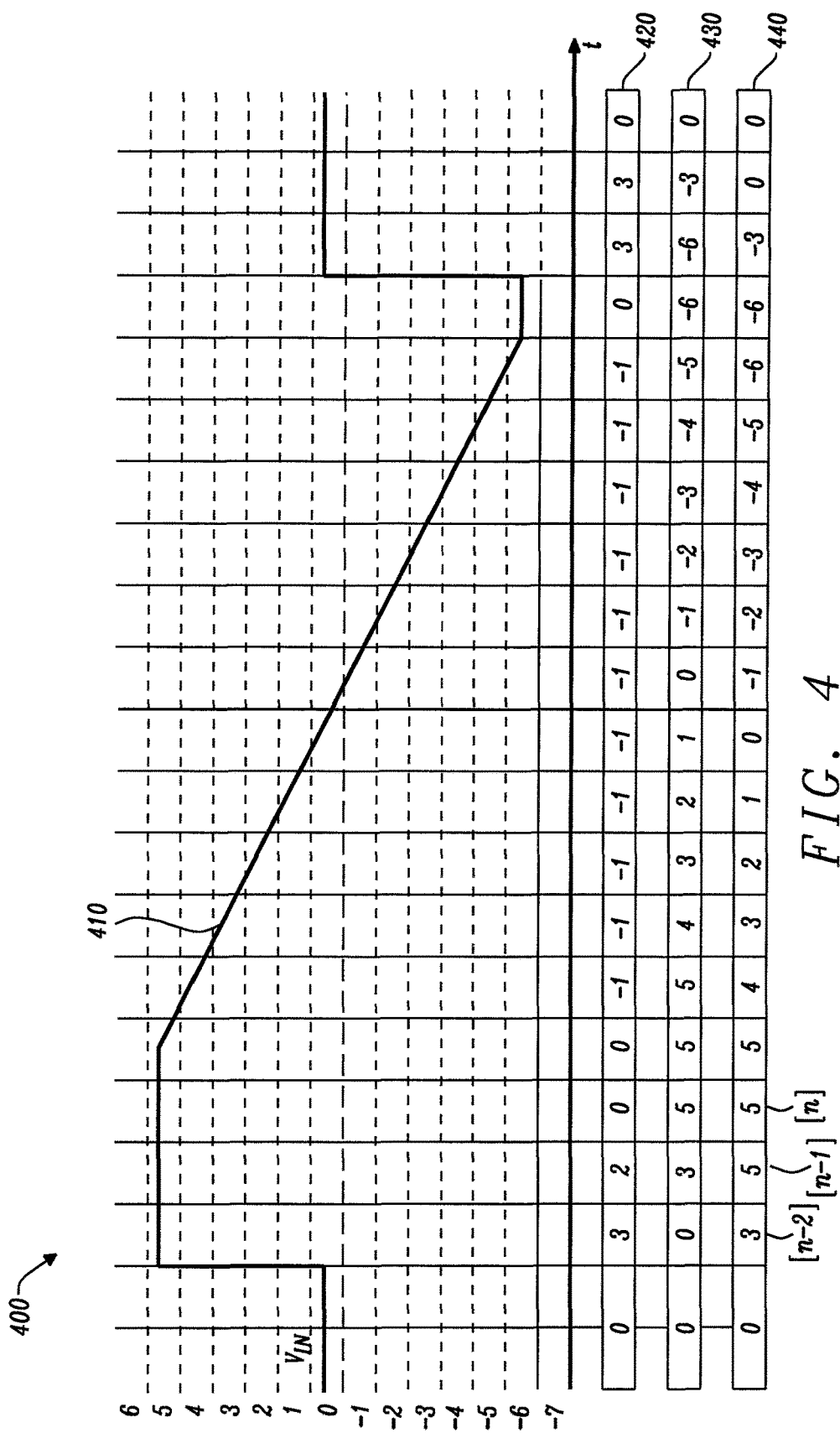
FIG. 4 schematically illustrates an example of sampling, tracking, and output in dependence on an input to a delay line ADC according to embodiments of the disclosure.

FIG. 4 schematically illustrates 400, an example of sampling, tracking, and output in dependence on an input to a delay line ADC according to embodiments of the disclosure. Graph 410 indicates an input voltage to the delay line ADC (e.g., a voltage differential). Arrays 420, 430, and 440 respectively indicate the sampled value (e.g., the number of delay units in the sampling section of the slower delay line indicating absence of a pulse on occurrence of the trigger from the faster delay line, or in general, the delay between the faster delay line and the slower delay line on occurrence of the trigger from the faster delay line), the tracking value (e.g., the number of bypassed/shortened cells in the tracking section of the slower delay line), and the digital output value (e.g., depending on the sum of the two aforementioned values). This example assumes a sampling window of 3 cells (3 sampling cells per delay line). Then, a voltage step of 5 (expressed in digital values of samples[n]) is represented as indicated in Table 1.

TABLE 1

| Cycle | [n − 2] | [n − 1] | [n] |
|---|---|---|---|
| Sampled value | 3 | 2 | 0 |
| Tracking value (number of shortened cells) | 0 | 3 | 5 |
| Digital output value | 3 | 5 | 5 |

This can also be seen from the second to fourth entries of arrays 420, 430, and 440. As can be seen, the overall digital output (corresponding to the delay in the absence of tracking) is fully represented by the tracking value, while the actual sampled value is zero, i.e., the pulses simultaneously arrive at the sampling sections of the two delay lines. In this state, if the input voltage decreases, the other (un-shortened) delay line will be the faster delay line, which is indicated by a sampled value of (−1). This is accounted for by successively reducing the number of shortened delay units in the now faster delay line.

As can be seen from FIG. 4, a bit resolution well in excess of what would be provided for by the (3 cell) sampling section alone is achieved by providing the tracking capability.

Thus, by employing tracking, the sampling section can be considerably narrowed (e.g., shortened), compared to conventional delay line ADCs, given a desired bit resolution.

Thereby, also the number of latches can be reduced, together with the required resolution of the encoders (as comprised by the sampling unit, e.g., thermal to binary encoders).

Notably, embodiments of the present disclosure may also be applied to a single-ended delay line ADC. In this case, one of the control signals (e.g., the first signal) may be indicative of a fixed reference voltage VREF and the other one of the control signals (e.g., the second signal) may be indicative of a (single-ended) input voltage $V_{IN}$. In this case, the first delay line would be the reference line and the second delay line would be the measurement line. Sampling (latching) and tracking (shorting) would be performed on the measurement line only.

Next, a delay line ADC according to embodiments of the disclosure will be described that is capable of dynamically adapting its resolution and transfer function. In general, tracking speed (steps per cycle) is limited by the sampling window size. Characteristic shaped transfer function is based on the number of cells used (e.g., per delay line). As has been found, an adaptive change of resolution and range can be based on the number of built in and active (unshorten) cells. Thus, broadly speaking, a change of resolution (and accordingly, range) can be achieved by shorting both delay lines by the same number of delay units (cells). This simultaneous shorting may be performed by the delay line control unit 335 in the delay line ADC 300 of FIG. 3, for example.

The transfer function (input stage transfer function, fully differential input to fully differential output) for a delay line ADC can be calculated as follows. Let the first and second signals $CTRL_M$ (M line control signal) and $CTRL_R$ (R line control signal) be given by $$CTRL_M = CM + \Delta V_{IN}$$

$$CTRL_R = CM - \Delta V_{IN}$$

where CM is a common mode signal and $\Delta V_{IN}$ is a differential input signal (differential input voltage).

The propagation delay of a single cell (delay unit) $t_{CELL}$ can be written as $$t_{CELL} = \frac{K}{CTRL}$$

where K is a constant and CTRL is the applicable control signal for the delay line in which the cell is located. Assuming that the overall run through times for the delay lines, $T_M$ and $T_R$, are aligned but with one LSB difference (i.e., assuming that the difference in run through times corresponds to one delay unit) and further assuming that the differential input voltage is positive $\Delta V_{IN} > 0$, would result in $T_M = T_R$ (Identical acquisition and run through time)

$$N * t_{CellM} = (N-1) * t_{CellR}$$

$$N * \frac{K}{CM + \Delta V_{IN}} = (N-1) * \frac{K}{CM - \Delta V_{IN}}$$

$$N * \frac{K}{CM + \Delta V_{IN}} = (N) * \frac{K}{CM - \Delta V_{IN}} - \frac{K}{CM - \Delta V_{IN}}$$

$$N * \left[ \frac{K*(CM + \Delta V_{IN}) - K*(CM - \Delta V_{IN})}{(CM - \Delta V_{IN})(CM + \Delta V_{IN})} \right] = \frac{K}{(CM - \Delta V_{IN})}$$

and finally, $$N = \frac{CM + \Delta V_{IN}}{2 * \Delta V_{IN}}$$

$$\Delta V_{IN} = \frac{CM}{2 * N - 1}$$

where $T_M$ is the run through time of line M, $T_R$ is the run through time of line R, N is the number of cells per line, and $\Delta V_N$ is the LSB size.

The number of cells used for the conversion depends on the desired transfer characteristic and resolution to be achieved. Setting tracking limits, a certain input referred window (tracking+sensing) of operation is defined. The above equations show the relation between LSB size and the number of implemented cells.

Assuming a linear input stage (e.g. V→I, voltage-to-current, conversion) the transfer characteristic is then only based on the number of cells used to determine the digital output signal.

Figure 5:
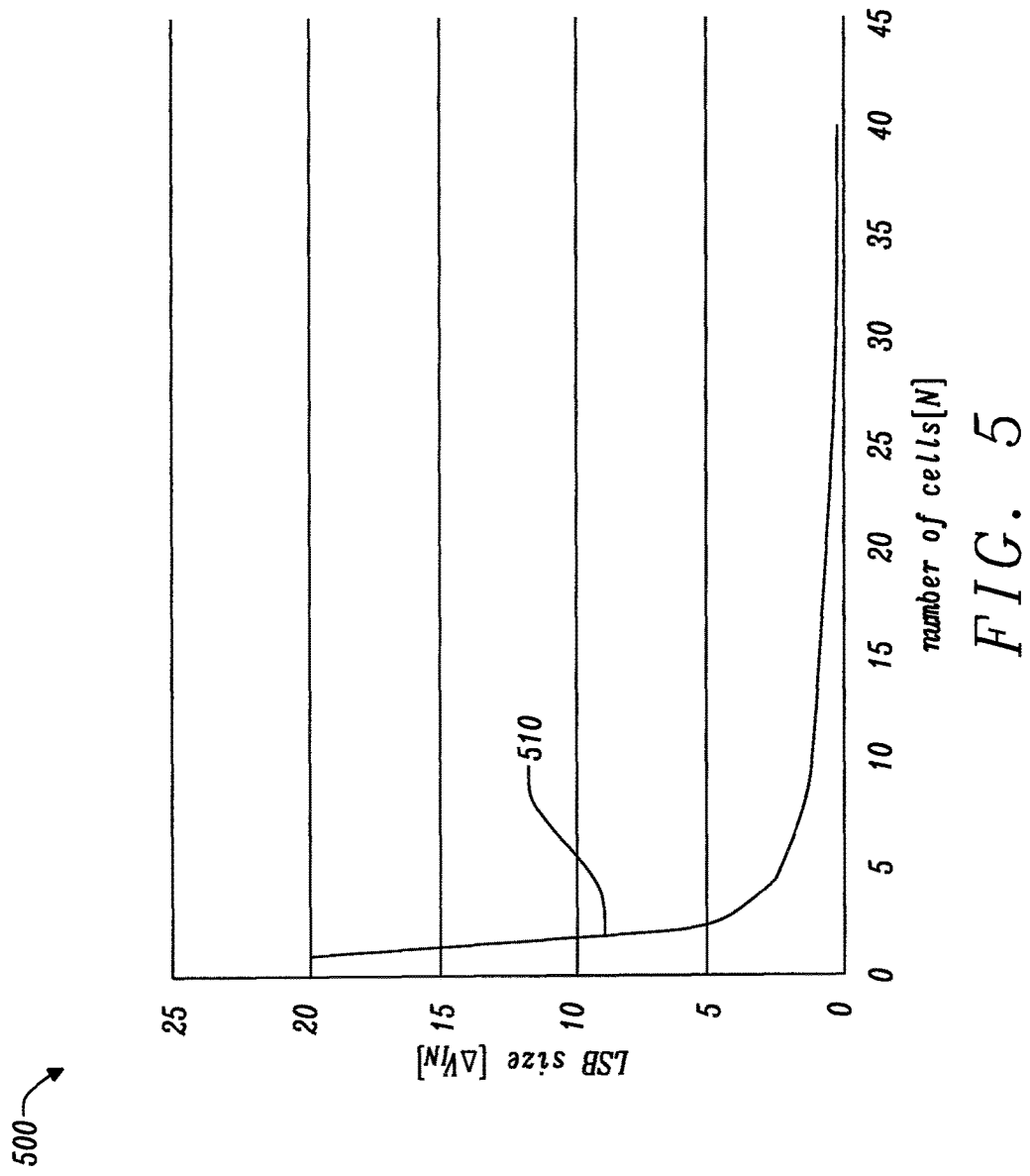
FIG. 5 illustrates an example of a graph showing a least significant bit size as a function of a number of delay units in each delay line of a delay line ADC according to embodiments of the disclosure.

FIG. 5 is 500, an illustration of the above calculation. It illustrates an example of a graph 510 showing a least significant bit size (OVEN) as a function of a number of delay units (N) in each delay line for a delay line ADC according to embodiments of the disclosure. A random but fixed CM number was chosen to be 2O. As can be seen from this figure, the LSB size is approximately proportional to an inverse of the number of cells N.

Figure 6:
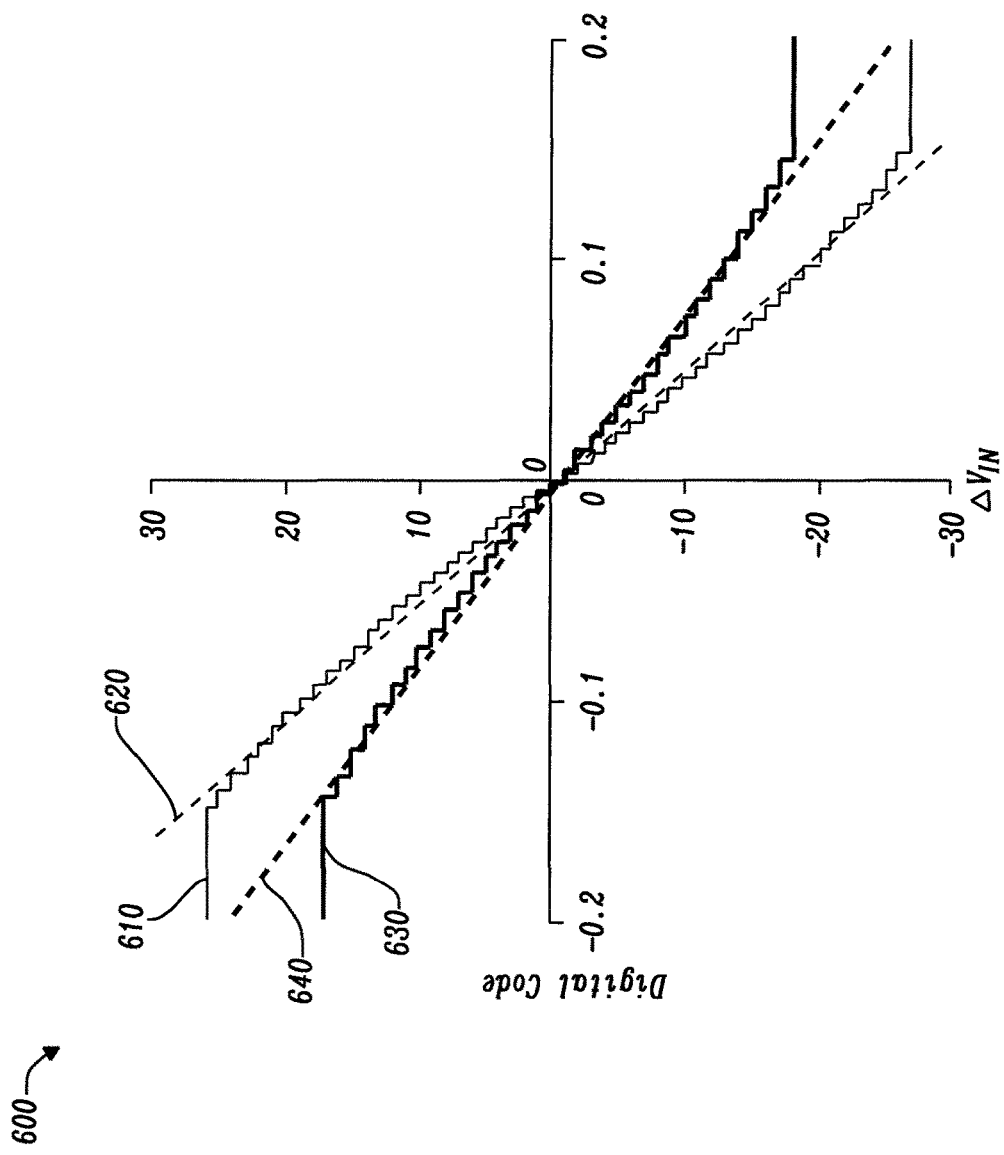
FIG. 6 illustrates an example of a graph showing a transfer function of a delay line ADC according to embodiments of the disclosure.
Figure 7:
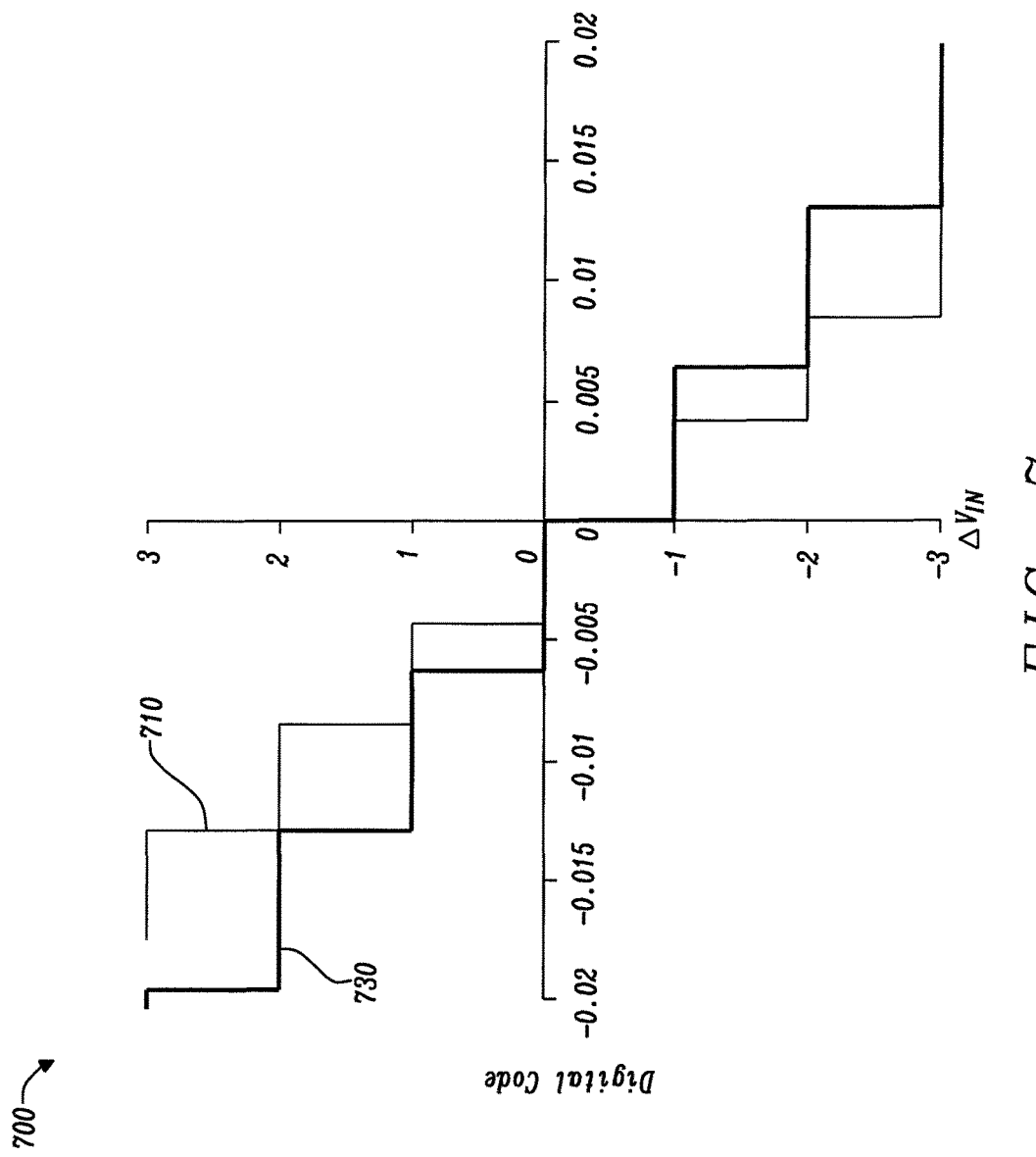
FIG. 7 illustrates details of the graph of FIG. 6, for very low input voltages and digital output.

FIG. 6 illustrates 600, an example of graphs showing a transfer function of a delay line ADC according to embodiments of the disclosure. FIG. 7 illustrates 700, details of the graphs of FIG. 6 for very low input voltages and digital output. These graphs show two different transfer functions possible with the same hardware by only changing the static tracking (e.g., bypassing) offset for both lines simultaneously. In this case both lines have the same static number of cells shorted. The graphs 610, 620, 710 show the transfer behavior with all cells [N] enabled and the graphs 630, 640, 730 show the transfer behavior for a reduced number (N-X, where X is a static short) of cells for both delay lines. Dashed graphs are linearized versions of solid-line graphs.

In both FIG. 6 and FIG. 7, besides input range variation and transfer function shaping, the resolution modulation (LSB size dependent on active number of cells) is visible.

Figure 8:
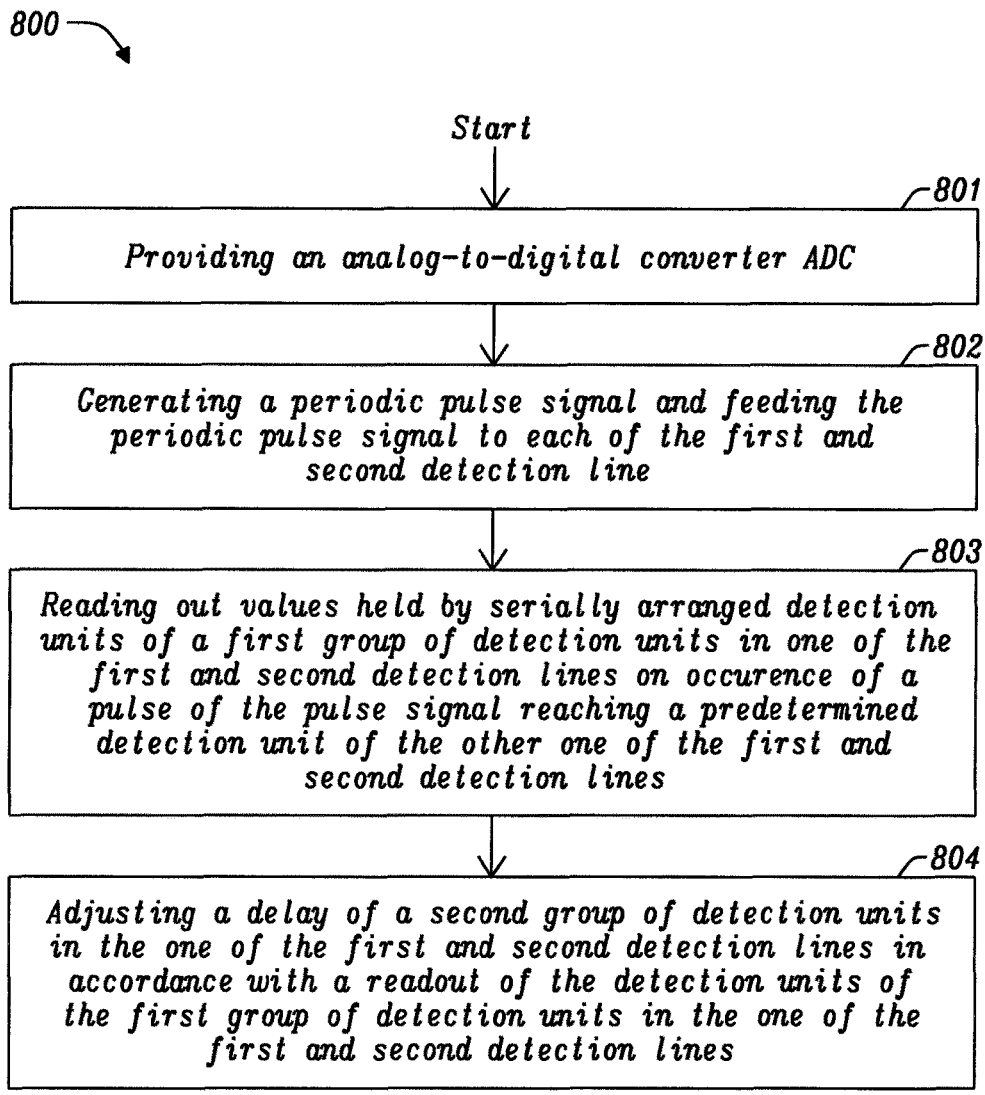
FIG. 8 illustrates a flow chart of a method for controlling an ADC by using cell-based detection in strings of consecutively connected detection cells.

FIG. 8 illustrates a flow chart of a method for controlling an ADC by using cell-based detection in strings of consecutively connected detection cells. The steps include 801, providing an analog-to-digital converter. The steps also include 802, generating a periodic pulse signal and feeding the periodic pulse signal to each of a first and second detection line. The steps also include 803, reading out values held by serially arranged detection units of a first group of detection units in one of the first and second detection lines on occurrence of a pulse of the pulse signal reaching a predetermined detection unit of the other one of the first and second detection lines. The steps also include 804, adjusting a delay of a second group of detection units in the one of the first and second detection lines in accordance with a read out of the detection units of the first group of detection units in the one of the first and second detection lines.

Advantages of delay line ADCs according to embodiments of the disclosure will be summarized below. Major advantages are low power operation, extensible range and reversible resolution. Employing the tracking architecture, the number of cells may be reduced compared to conventional delay line ADCs.

Moreover, shorting (bypassing) an equal number of cells on both lines may reduce the range and resolution. Thereby, if a lower resolution than presently available is desired, power consumption can be reduced, since shorting equal number of cells on both lines will reduce power consumption. Trimming the lines is possible by adding a static tracking offset. Lastly, shaped (multiple or non-linear or as a function of the transfer function but well defined) consecutively connected cells can be achieved using "unshaped" unity cells to obtain uniquely defined transfer characteristics.

Further, delay line ADCs according to embodiments of the disclosure also have the following properties: Equal input signals and consequently uniform run through times create common mode noise which is cancelled out by the differential architecture. An offset can be removed by altering the lines (after the input stage) or by altering the inputs. A cell to cell mismatch within a given line is averaged until the sensing cells are reached. Active averaging of input signal during acquisition time (run through of cells) acts as a first order moving filter.

It should be noted that the apparatus features described above correspond to respective method features that may however not be explicitly described, for reasons of conciseness.

The disclosure of the present document is considered to extend also to such method features. In particular, the present disclosure is understood to relate to methods of operating the circuits described above, and/or to providing or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. An analog-to-digital converter, ADC, comprising:
   a first detection line and a second detection line, each including a plurality of serially arranged detection units, wherein the detection units of the first detection line are controlled in accordance with a first signal and the detection units of the second detection line are controlled in accordance with a second signal and wherein each detection line comprises a first group of serially arranged detection units and a second group of serially arranged detection units;
   a pulse generator for generating a periodic pulse signal that is fed to each of the first and second detection lines;
   a sampling unit configured to read out values held by the detection units of the first group of detection units in one of the first and second detection lines on occurrence of a pulse of the pulse signal reaching a predetermined detection unit of the other one of the first and second detection lines; and
   a detection line control unit configured to adjust a delay of the second group of detection units in the one of the first and second detection lines in accordance with a read out of the detection units of the first group of detection units in the one of the first and second detection lines, wherein the delay of the second group of detection units is adjusted by selectively bypassing detection units.

2. The ADC according to claim 1, wherein a number of bypassed detection units in the second group of detection units of the one of the first and second detection lines depends on a number of detection units in the first group of detection units of the one of the first and second detection lines that hold values indicating absence of a pulse on occurrence of the pulse of the pulse signal reaching the predetermined detection unit of the other one of the first and second detection lines.

3. The ADC according to claim 1, wherein the number of bypassed detection units is chosen so that run through times of the first and second detection lines are substantially aligned.

4. The ADC according to claim 1, wherein detection cells are bypassed for at most one of the first and second detection lines at a time.

5. The ADC according to claim 1, wherein an output of the ADC depends on a sum of a number of detection units that are currently bypassed on occurrence of the pulse of the pulse signal reaching the predetermined detection unit of the other one of the first and second detection lines and the number of detection units in the first group of detection units of the one of the first and second detection lines that hold values indicating absence of a pulse on occurrence of the pulse of the pulse signal reaching the predetermined detection unit of the other one of the first and second detection lines.

6. The ADC according to claim 1, wherein the delay of the second group of detection units in the one of the first and second detection lines is adjusted for a next pulse of the pulse signal.

7. The ADC according to claim 1, wherein the first signal and the second signal are indicative of an input analog signal differential and are offset from a common mode signal by opposite signs.

8. The ADC according to claim 1, wherein the first signal is indicative of a fixed reference analog signal and the second signal is indicative of an input analog signal.

9. The ADC according to claim 8, wherein the one of the first and second detection lines is the second detection line and the other one of the first and second detection lines is the first detection line.

10. The ADC according to claim 1, wherein the detection line control unit is further configured to adjust a delay of the second group of detection units in the first detection line and a delay of the second group of detection units in the second detection line by the same amount, by selectively bypassing detection units.

11. The ADC according to claim 10, wherein the delay of the second group of detection units in the first detection line and the delay of the second group of detection units in the second detection line are adjusted in accordance with a desired resolution of the ADC.

12. The ADC according to claim 1, further comprising an input stage, the input stage including one or more operational amplifiers for generating the first and second signals from one or more input analog signals.

13. A delay line analog-to-digital converter, ADC, comprising:
a first detection line and a second detection line, each including a plurality of serially arranged detection units, wherein the detection units of the first detection line are controlled in accordance with a first signal and the detection units of the second detection line are controlled in accordance with a second signal and wherein each detection line comprises a first group of serially arranged detection units and a second group of serially arranged detection units;
a pulse generator for generating a periodic pulse signal that is fed to each of the first and second detection lines;
a sampling unit configured to read out values held by the detection units of the first group of detection units in one of the first and second detection lines on occurrence of a pulse of the pulse signal reaching a predetermined detection unit of the other one of the first and second detection lines; and
a detection line control unit configured to adjust a delay of the second group of detection units in the first detection line and a delay of the second group of detection units in the second detection line by the same amount, by selectively bypassing detection units.

14. The ADC according to claim 13, wherein the delay of the second group of detection units in the first detection line and the delay of the second group of detection units in the second detection line are adjusted in accordance with a desired resolution of the ADC.

15. A method of operating an analog-to-digital converter, ADC, the ADC comprising a first detection line and a second detection line, each including a plurality of serially arranged detection units, wherein the detection units of the first detection line are controlled in accordance with a first signal and the detection units of the second detection line are controlled in accordance with a second signal and wherein each detection line comprises a first group of serially arranged detection units and a second group of serially arranged detection units,
the method comprising:
generating a periodic pulse signal and feeding the periodic pulse signal to each of the first and second detection lines;
reading out values held by the detection units of the first group of detection units in one of the first and second detection lines on occurrence of a pulse of the pulse signal reaching a predetermined detection unit of the other one of the first and second detection lines; and
adjusting a delay of the second group of detection units in the one of the first and second detection lines in accordance with a read out of the detection units of the first group of detection units in the one of the first and second detection lines, wherein the delay of that second group of detection units is adjusted by selectively bypassing detection units.

16. The method according to claim 15, wherein the number of bypassed detection units in the second group of detection units of the one of the first and second detection lines depends on the number of detection units in the first group of detection units of the one of the first and second detection lines that hold values indicating absence of a pulse on occurrence of the pulse of the pulse signal reaching the predetermined detection unit of the other one of the first and second detection lines.

17. The method according to claim 15, wherein the number of bypassed detection units is chosen so that the run through times of the first and second detection lines are substantially aligned.

18. The method according to claim 15, wherein detection cells are bypassed for at most one of the first and second detection lines at a time.

19. The method according to claim 15, further comprising:
outputting a digital value that depends on a sum of the number of detection units that are currently bypassed on occurrence of the pulse of the pulse signal reaching the predetermined detection unit of the other one of the first and second detection lines and the number of detection units in the first group of detection units of the one of the first and second detection lines that hold values indicating absence of a pulse on occurrence of the pulse of the pulse signal reaching the predetermined detection unit of the other one of the first and second detection lines.

20. The method according to claim 15, wherein the delay of the second group of detection units in the one of the first and second detection lines is adjusted for a next pulse of the pulse signal.

21. The method according to claim 15, wherein the first signal and the second signal are indicative of an input analog signal differential and are offset from a common mode signal by opposite signs.

22. The method according to claim 15, wherein the first signal is indicative of a fixed reference voltage and the second signal is indicative of an input voltage.

23. The method according to claim 22, wherein the one of the first and second detection lines is the second detection line and the other one of the first and second detection lines is the first detection line.

24. The method according to claim 15, further comprising adjusting a delay of the second group of detection units in the first detection line and a delay of the second group of detection units in the second detection line by the same amount, by selectively bypassing detection units.

25. The method according to claim 24, wherein the delay of the second group of detection units in the first detection line and the delay of the second group of detection units in the second detection line are adjusted in accordance with a desired resolution of the ADC.

26. The method according to claim 15, further comprising generating the first and second signals from one or more input analog signals by means of one or more operational amplifiers.

27. A method of operating an analog-to-digital converter, ADC, the ADC comprising a first detection line and a second detection line, each including a plurality of serially arranged detection units, wherein the detection units of the first detection line are controlled in accordance with a first signal and the detection units of the second detection line are controlled in accordance with a second signal and wherein each detection line comprises a first group of serially arranged detection units and a second group of serially arranged detection units, the method comprising:

generating a periodic pulse signal and feeding the periodic pulse signal to each of the first and second detection lines;

reading out values held by the detection units of the first group of detection units in one of the first and second detection lines on occurrence of a pulse of the pulse signal reaching a predetermined detection unit of the other one of the first and second detection lines; and adjusting a delay of the second group of detection units in the first detection line and a delay of the second group of detection units in the second detection line by the same amount, by selectively bypassing detection units.

28. The method according to claim 27, wherein the delay of the second group of detection units in the first detection line and the delay of the second group of detection units in the second detection line are adjusted in accordance with a desired resolution of the ADC.

* * * * *